(12) United States Patent
Reker et al.

(10) Patent No.: US 7,218,507 B2
(45) Date of Patent: May 15, 2007

(54) DISTRIBUTOR MEANS FOR CONNECTING ELECTRICAL APPARATUS WITH A LIGHTING DEVICE

(75) Inventors: Stefan Reker, Bielefeld (DE); Andreas Hoffmann, Lemgo (DE)

(73) Assignee: Weidmüller GmbH & Co. KG, Detmold (DE)

( * ) Notice: Subject to any disclaimer, the term of this patent is extended or adjusted under 35 U.S.C. 154(b) by 413 days.

(21) Appl. No.: 10/962,714

(22) Filed: Oct. 13, 2004

(65) Prior Publication Data

US 2005/0088046 A1     Apr. 28, 2005

(30) Foreign Application Priority Data

Oct. 15, 2003 (DE) ................. 203 15 838

(51) Int. Cl.
*H02B 1/26* (2006.01)
*H05K 5/02* (2006.01)

(52) U.S. Cl. .................... 361/641; 174/50

(58) Field of Classification Search .......... None
See application file for complete search history.

(56) References Cited

U.S. PATENT DOCUMENTS 5,095,403 A * 3/1992 Pin et al. ............... 361/641
5,212,623 A * 5/1993 Wilson et al. ............ 361/625
5,784,249 A * 7/1998 Pouliot .................... 361/622
5,821,636 A * 10/1998 Baker et al. ............... 307/70
5,905,630 A * 5/1999 Wetterling ................ 361/625
6,229,691 B1 * 5/2001 Tanzer et al. ............. 361/622

FOREIGN PATENT DOCUMENTS

| DE | 28 37 209 A1 | 3/1980 |
|---|---|---|
| DE | 43 31 682 C2 | 8/1996 |
| DE | 38 08 770 C2 | 10/1996 |
| DE | 196 47 218 C1 | 4/1998 |
| DE | 197 16 137 C1 | 10/1998 |
| DE | 299 19 900 U1 | 5/2001 |
| DE | 202 05 380 U1 | 9/2003 |
| WO | WO 01/96817 A1 | 12/2001 |

* cited by examiner

*Primary Examiner*—Greg Thompson
(74) *Attorney, Agent, or Firm*—Lawrence E. Laubscher, Sr.; Lawrence E. Laubscher, Jr.

(57) ABSTRACT

A distributor is provided for selectively connecting with a voltage source a plurality of electrical load devices, such as the sensors or actuators of an electrical and mechanical installation, characterized by the provision of an illuminating field that illuminates the addressing switches and/or the changeover switches of the distributor.

6 Claims, 2 Drawing Sheets

DISTRIBUTOR MEANS FOR CONNECTING ELECTRICAL APPARATUS WITH A LIGHTING DEVICE

CROSS REFERENCE TO RELATED APPLICATIONS

This is a companion application to the Reker application Ser. No. 10/962,705 filed Oct. 13, 2004.

BACKGROUND OF THE INVENTION

1. Field of the Invention

A distributor is provided for selectively connecting with at least one voltage source a plurality of electrical devices, such as the sensors and actuators of an electromechanical installation, characterized by the provision of means for illuminating and/or magnifying the images of the various addressing switches and changeover switches of the distributor.

2. Brief Description of the Related Prior Art

Various voltage distribution systems have been proposed in the prior art for supplying power to various types of electrical loads for the replacement of the relatively expensive prior solutions, particularly in the field of automation technology.

There is a need for optimization here, especially with regard to the voltage supply of the distributors and the electrical appliances to be connected to them. According to the present invention, a distributor including a housing is provided for the connection of electrical appliances such as actuators, sensors or the like with a voltage source. The distributor includes first connections for the connection of electrical appliances, at least one second connection for connection of a higher-ranking bus voltage supply system, a plurality of addressing and/or changeover switches. Distributors of this kind in the passive or active mode are becoming increasingly popular in the field of automation technology and replace previously proposed solutions there that were more expensive.

It is important to note that the distributors facilitate not only a simple and fast connection of all necessary cables, but also a simple and fast setting of all necessary parameters, especially addresses. This adjusting function generally takes place with jumpers or the like.

The present invention was developed to facilitate the operation of these addressing and/or changeover switches when compared to the state of the art, use being made of illuminating means for illuminating the addressing and changeover switches.

BRIEF SUMMARY OF THE INVENTION

Accordingly, a primary object of the present invention is to provide a distributor arrangement that is operable to supply power from a first voltage source to a plurality of electrical loads, such as appliances, via addressing and/or jumper switches, characterized in that the switches are illuminated or arranged within an illuminated field for the improved operability thereof.

The illumination of at least either the switches or a field surrounding them, on the one hand, makes it easier to find the corresponding switches and, on the other hand, also facilitates their operation and in this case especially the lugging of jumpers or the like into a different socket. One must also emphasized the increased safety because erroneous settings are avoided in the simplest way by means of the illumination.

Optionally, the switch operability is improved by the simple implementation of a clear view cap that extends over the switches that can also act as a magnifying glass.

According to a more specific object of the invention, a housing carries first and second supply voltage connectors having first pins that are continuously connected together, a first pin of the first connector being connected with the distributor internal electronics circuitry, and the first pin of the second connector being connected with a first voltage source. A second pin of the first voltage supply connector is connected with the first group electrical load devices, and the second pin of the second voltage supply connector is connected with a second voltage source, these second pins being connected via a selectively operable jumper or changeover switch. A second group of electrical load devices is connected with the second pin of the second supply voltage connector.

As a result of this measure, it is possible to supply groups of distributors separately and preferably also to switch and/or—when the group formation is not needed—to connect the voltage from a voltage supply connection to a next distributor in order when there is a small power output requirement to supply one group of several distributors only once with the voltage.

BRIEF DESCRIPTION OF THE DRAWINGS

Other objects and advantages of the invention will become apparent from a study of the following specification when viewed in the light of the accompanying drawings, in which.

DETAILED DESCRIPTION OF THE INVENTION

Figure 1:
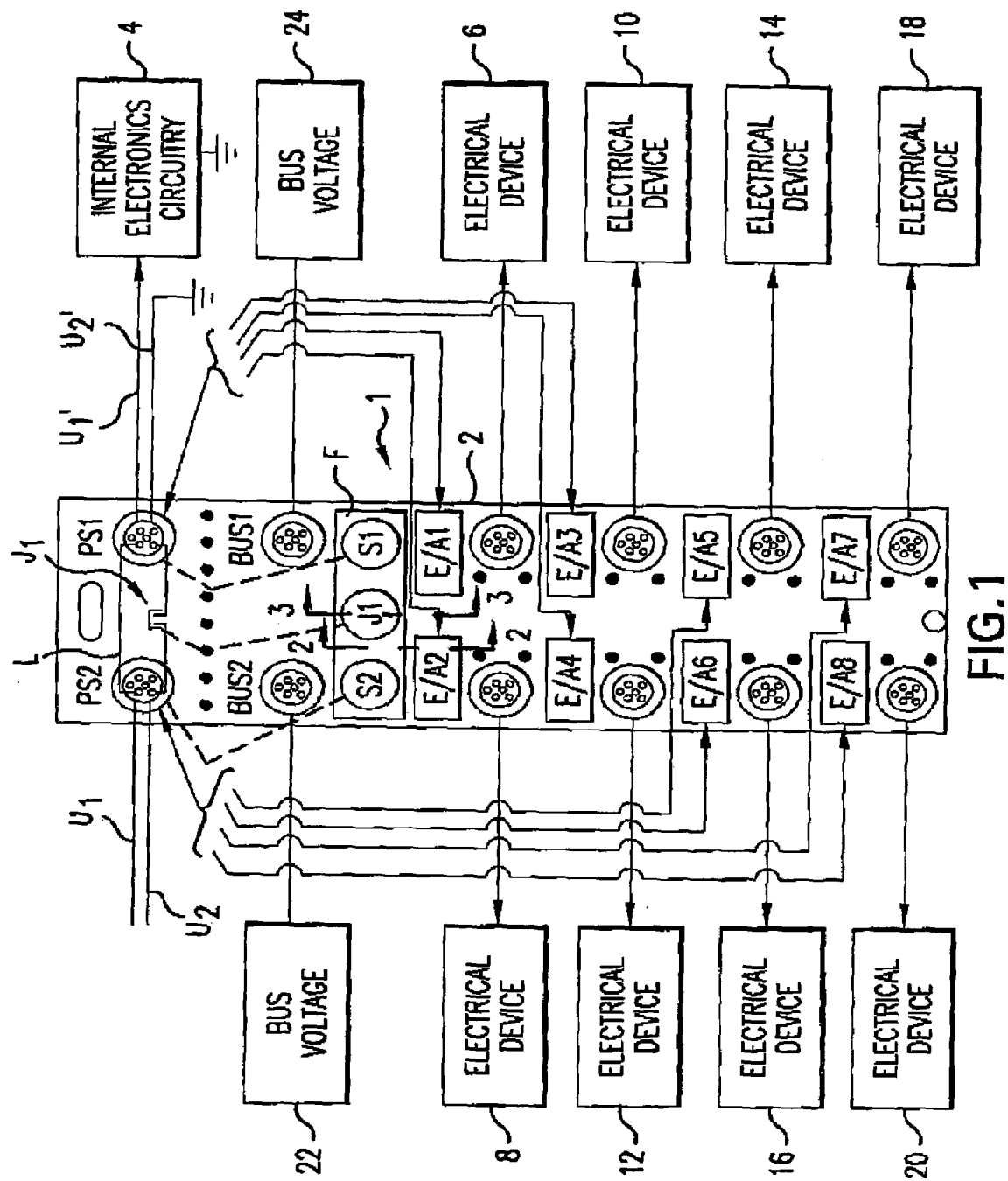
FIG. 1 is a block diagram illustrating the voltage distribution system of the present invention.

Referring first more particularly to FIG. 1, the distributor means 1 of the present invention includes a housing 2 that contains the internal electronics circuitry 4. Mounted on the housing are a plurality of electrical device connections E/A1 to E/A8 connected with the electrical loads 6, 8, 10, 12, 14, 16, and 18, respectively. Also mounted on the housing are a pair of bus connectors BUS1 and BUS2 that are connected with the high-voltage bus supplies 22 and 24, respectively.

Finally, a pair of supply voltage connectors PS1 and PS2 are mounted on the housing for connection with the supply voltage lines $U_1$, and $U_2$. More particularly, the first supply voltage connector PS1 includes a first pin that is connected with the distributor internal electronics circuitry by the line $U_1$ and a plurality of second pins that are selectively connected with a first group of electrical load devices 6, 8, 10, 12 as controlled by an addressing switch S1. Similarly, the second supply voltage connector PS2 includes a first pin connected with the first voltage source $U_1$, and a plurality of second pins that are connected with the second voltage source $U_2$ to supply power to a second group of electrical load devices 14, 16, 18, and 20 as controlled by the second addressing switch S2.

The first pins of the first and second supply voltage connectors PS1 and PS2 are continuously connected by the line L, whereby power is continuously supplied from voltage source $U_1$ to the internal electronics circuitry 4. The second pins of the supply voltage connectors PS1 and PS2 are connected via the contacts of a changeover or jumper switch J1.

Using the addressing switches S1 and S2, addresses can be assigned to the first connections E/A1, . . . whereas the changeover switch (Jumper J1), for example, serves for the connection and separation of the supply line connections PS1 and PS2 (for example, in the "M8 Standard" or the like).

The voltage supply connections PS1 and PS2 each have several connecting pins that are partly used for signal transmission and partly for voltage supply.

In operation, by using Jumper J1, one can either connect both groups of the electrical load devices to the voltage source U2, or only the second group E/A5 to E/A8. Supply of voltage to the individual loads of this group is controlled by the addressing switch S2.

According to a characterizing feature of the present invention, the addressing switches and the changeover switches S1, S2, J1 in this case are arranged in an illumination field F made of a transparent material, which, for instance, is illuminated by means of light diodes or the like directly or via inserted light conductors to make it easier to find, thereby assisting in the setting, adjustment and the handling of switches S1, S2 and J1.

Figure 2:
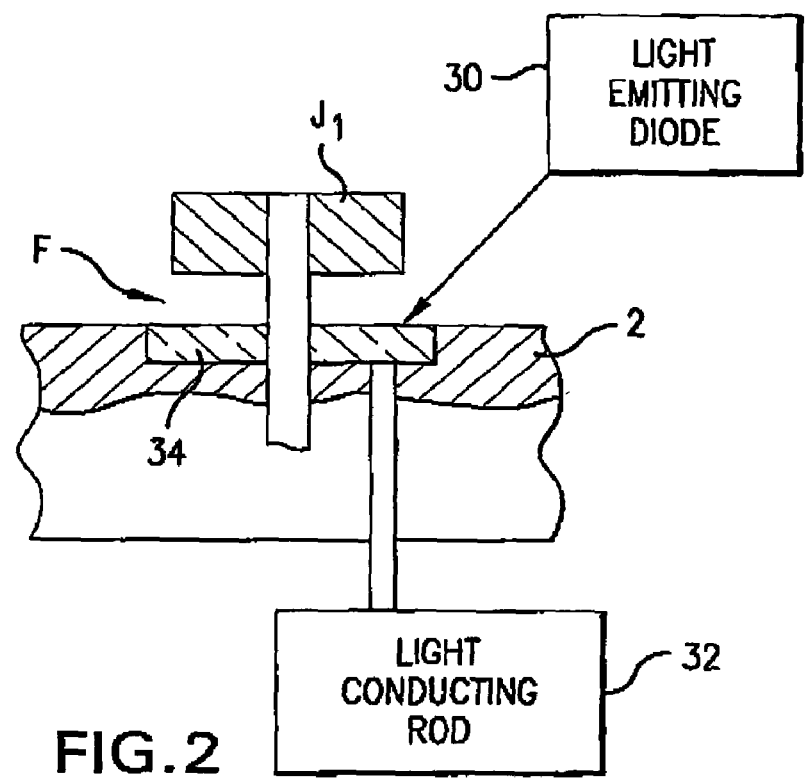
FIG. 2 is a sectional view taken along line 2—2 of FIG. 1.

According to a first embodiment, the means for producing the illuminated field is inserted in a corresponding cutout or opening formed in the housing, and it can also be extended over larger areas of the housing and can be used also to illuminate the electrical connections or the like. As for handling, it must be emphasized as particularly advantageous that all connections and switches are arranged on a common side of housing 1—specifically on the top. As shown in FIG. 2, the illuminated field F is produced by directing light from a suitable light source—such as a light emitting diode 30 or from a light conducting rod 32—into a clear transparent plate 34 that is embedding in a recess contained in the upper surface of the distributor housing 2. The illumination field may be extended over larger areas of the housing, and can also be used to illuminate the electrical connections.

Figure 3:
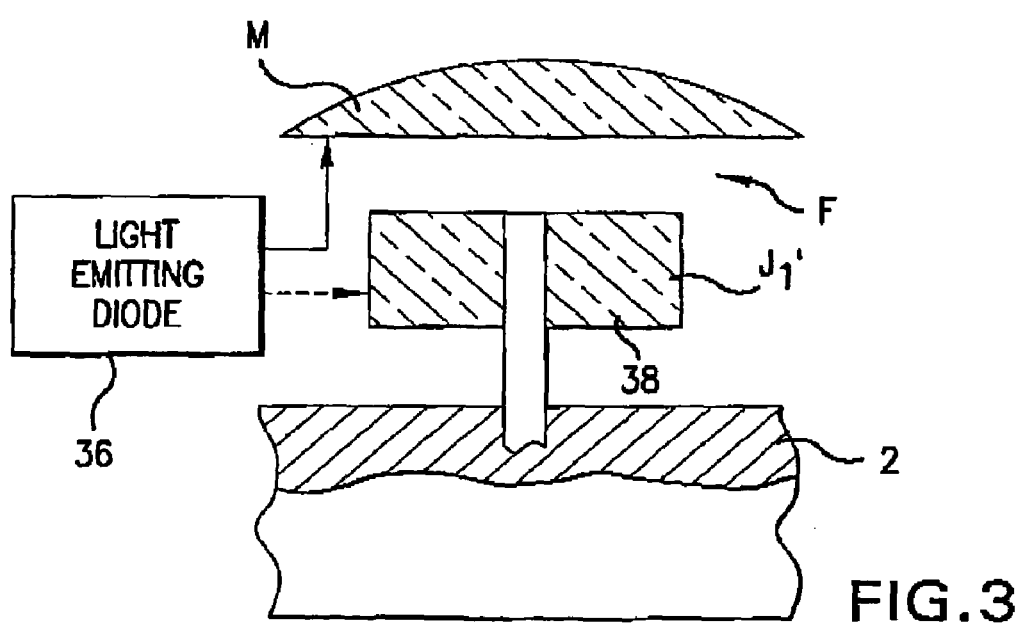
FIG. 3 is a sectional view of a modification of the invention taken along the line 3—3 of FIG. 1.

In the embodiment of FIG. 3, the illuminated field F is produced by introducing light from a suitable light source 36 into a layer of transparent material M arranged above the switch $J_1'$. In this case, the layer M may constitute a magnifying glass for magnifying the image of the switch operating knob 38.

As an alternative, it would also be possible to make switches S1, S2, J1 themselves in an illuminated fashion. More particularly, the switch operating knob itself may constitute the transport member that is illuminated by the light source 36.

While in accordance with the provisions of the Patent Statutes the preferred forms and embodiments of the invention have been illustrated and described, it will be apparent to those skilled in the art that various changes may be made without deviating from the inventive concepts set forth above.

What is claimed is:

1. Distributor means for supplying voltages to a plurality of electrical load devices, such as sensors and actuators, comprising:
   (a) a housing (1) containing internal distributor electronics means (4);
   (b) a plurality of first electrical device connectors (E/A1–E/A4) mounted on said housing for connection with a first group of electrical load devices, respectively;
   (c) at least one bus connector (BUS1, BUS2) mounted on said housing for connection with a bus voltage source;
   (d) voltage supply connector means (PS1, PS2, J1) supplying electrical power to the electrical load devices;
   (e) addressing and changeover switch means (S1, S2, J1) for operating said voltage supply connection means; and
   (f) field illuminating means (F) for illuminating said addressing and changeover switch means.

2. Distributor means as defined in claim 1, wherein said addressing and changeover switch means include an illuminated operating member (38).

3. Distributor means as defined in claim 1, wherein said illuminated field is produced by a layer of transparent material (34) that is illuminated by a light source (30; 32).

4. Distributor means as defined in claim 3, wherein said illuminated field is produced by a layer of transparent material (M) that extends at least partially in spaced relation above said addressing and changeover switch means.

5. Distributor means as defined in claim 4, wherein said layer of transparent material defines magnifying means for magnifying the image of at least one of said addressing and changeover switch means.

6. Distributor means as defined in claim 1, wherein said addressing and changeover switch means extend from a common side of the housing.

* * * * *